(12) United States Patent
Kronholz et al.

(10) Patent No.: US 8,642,419 B2
(45) Date of Patent: Feb. 4, 2014

(54) METHODS OF FORMING ISOLATION STRUCTURES FOR SEMICONDUCTOR DEVICES

(75) Inventors: Stephan Kronholz, Dresden (DE); Jorg Radecker, Dresden (DE); Hans-Juergen Thees, Dresden (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/400,407

(22) Filed: Feb. 20, 2012

(65) Prior Publication Data
US 2013/0214381 A1 Aug. 22, 2013

(51) Int. Cl.
*H01L 21/8238* (2006.01)

(52) U.S. Cl.
USPC .............................. 438/207; 438/424; 438/435

(58) Field of Classification Search
USPC .......... 438/207, 424, 425, 427, 435, 436, 437
See application file for complete search history.

(56) References Cited

U.S. PATENT DOCUMENTS

| 5,017,999 | A | 5/1991 | Roisen et al. | |
| 7,981,801 | B2 * | 7/2011 | Chuang et al. | 438/691 |
| 8,319,311 | B2 * | 11/2012 | Chen et al. | 438/435 |
| 2008/0315267 | A1 * | 12/2008 | Hampp et al. | 438/444 |
| 2009/0127648 | A1 * | 5/2009 | Chen et al. | 438/425 |
| 2010/0230757 | A1 * | 9/2010 | Chen et al. | 438/435 |
| 2011/0049669 | A1 * | 3/2011 | Lee | 438/435 |

* cited by examiner

*Primary Examiner* — Kevin M Picardat
(74) *Attorney, Agent, or Firm* — Amerson Law Firm, PLLC

(57) ABSTRACT

Disclosed herein are various methods of forming isolation structures, such as trench isolation structures, for semiconductor devices. In one example, the method includes forming a trench in a semiconducting substrate, forming a lower isolation structure in the trench, wherein the lower isolation structure has an upper surface that is below an upper surface of the substrate, and forming an upper isolation structure above the lower isolation structure, wherein a portion of the upper isolation structure is positioned within the trench.

9 Claims, 3 Drawing Sheets

METHODS OF FORMING ISOLATION STRUCTURES FOR SEMICONDUCTOR DEVICES

BACKGROUND OF THE INVENTION

1. Field of the Invention

Generally, the present disclosure relates to the manufacturing of sophisticated semiconductor devices, and, more specifically, to various methods of forming isolation structures, such as trench isolation structures, for semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To make an integrated circuit on a semiconducting substrate, the various semiconductor devices, e.g., transistors, capacitors, etc., are electrically isolated from one another by so-called isolation structures. Currently, most sophisticated integrated circuit devices employ so-called shallow trench isolation (STI) structures. As the name implies, STI structures are made by forming a relatively shallow trench in the substrate and thereafter filling the trench with an insulating material, such as silicon dioxide. One technique used to form STI structures initially involves growing a pad oxide layer on the substrate and depositing a pad nitride layer on the pad oxide layer. Thereafter, using traditional photolithography and etching processes, the pad oxide layer and the pad nitride layer are patterned. Then, an etching process is performed to form trenches in the substrate for the STI structure using the patterned pad oxide layer and pad nitride layer as an etch mask. Thereafter, a deposition process is performed to overfill the trenches with an insulating material such as silicon dioxide. A chemical mechanical polishing (CMP) process is then performed using the pad nitride layer as a polish-stop layer to remove the excess insulation material. Then, a subsequent deglazing (etching) process may be performed to insure that the insulating material is removed from the surface of the pad nitride layer. This deglaze process removes some of the STI structures.

Numerous processing operations are performed in a very detailed sequence, or process flow, to form such integrated circuit devices, e.g., deposition processes, etching processes, heating processes, masking operations, etc. One problem that arises with current processing techniques is that, after the STI regions are formed, at least portions of the STI regions are exposed to many subsequent etching or cleaning processes that tend to consume, at least to some degree, portions of the STI structures subjected to such etching processes. As a result, the STI structures may not perform their isolation function as intended which may result in problems such as increased leakage currents, etc. Furthermore, since the erosion of the STI structures is not uniform across a die or a wafer, such structures may have differing heights, which can lead to problems in subsequent processing operations. For example, such height differences may lead to uneven surfaces on subsequently deposited layers of material which may require additional polishing time in an attempt to planarize the surface of such layers. Such additional polishing may lead to the formation of additional particle defects which may reduce device yields.

The present disclosure is directed to various methods of forming epitaxially formed layers of material and semiconductor devices incorporating such layers of material that may at least reduce or eliminate one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolation structures, such as trench isolation structures, for semiconductor devices. In one example, the method includes forming a trench in a semiconducting substrate, forming a lower isolation structure in the trench, wherein the lower isolation structure has an upper surface that is below an upper surface of the substrate, and forming an upper isolation structure above the lower isolation structure, wherein a portion of the upper isolation structure is positioned within the trench.

Another illustrative method disclosed herein includes the steps of forming a trench in a semiconducting substrate, depositing a first layer of insulating material above the substrate and in said trench and removing portions of the first layer of insulating material to thereby define a lower isolation structure in the trench, wherein the lower isolation structure has an upper surface that is below an upper surface of the substrate. This illustrative method further includes the steps of depositing a second layer of insulating material above the substrate, the lower isolation structure and in the trench and removing portions of the second layer of insulating material to thereby define an upper isolation structure above the lower isolation structure, wherein a portion of the upper isolation structure is positioned within the trench.

An illustrative device disclosed herein includes a semiconducting substrate, a trench formed in the substrate, a lower isolation structure positioned in the trench, wherein the lower isolation structure has an upper surface that is below an upper surface of the substrate, and an upper isolation structure positioned above the lower isolation structure, wherein a portion of the upper isolation structure is positioned within the trench.

BRIEF DESCRIPTION OF THE DRAWINGS

The disclosure may be understood by reference to the following description taken in conjunction with the accompanying drawings, in which like reference numerals identify like elements, and in which.

Figure 1A:
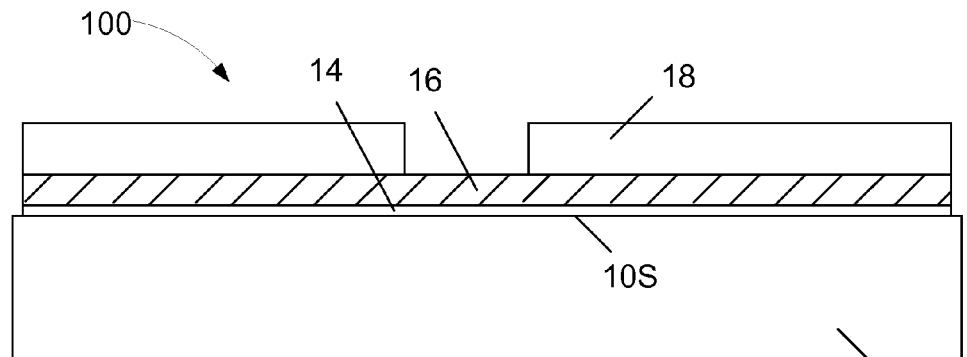
FIGS. 1A-1I depict various novel methods disclosed herein for forming isolation structures for semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming isolation structures, such as trench isolation structures, for semiconductor devices. As will be readily apparent to those skilled in the art upon a complete reading of the present application, the present method is applicable to a variety of devices, including, but not limited to, logic devices, memory devices, etc. With reference to FIGS. 1A-1I, various illustrative embodiments of the methods and devices disclosed herein will now be described in more detail.

FIG. 1A is a simplified view of an illustrative semiconductor device 100 at an early stage of manufacturing. The semiconductor device 100 is formed above an illustrative bulk semiconducting substrate 10 having an upper surface 10S. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

In FIG. 1A, the device 100 is depicted at the point of fabrication where an illustrative protection layer 14, e.g., a screen or pad oxide layer, and a polish stop layer 16, e.g., a pad nitride layer, have been formed above the substrate 10. Also depicted in FIG. 1A is a patterned mask layer 18, e.g., a patterned photoresist mask that may be formed using traditional photolithography tools and techniques. In one illustrative example, the protection layer 14 may be a pad oxide layer having a thickness on the order of about 10 nm, and it may be formed by performing a thermal growth process. In one illustrative example, the polish stop layer 16 may be a pad nitride layer having a thickness on the order of about 80 nm, and it may be formed by performing a chemical vapor deposition (CVD) process.

Figure 1B:
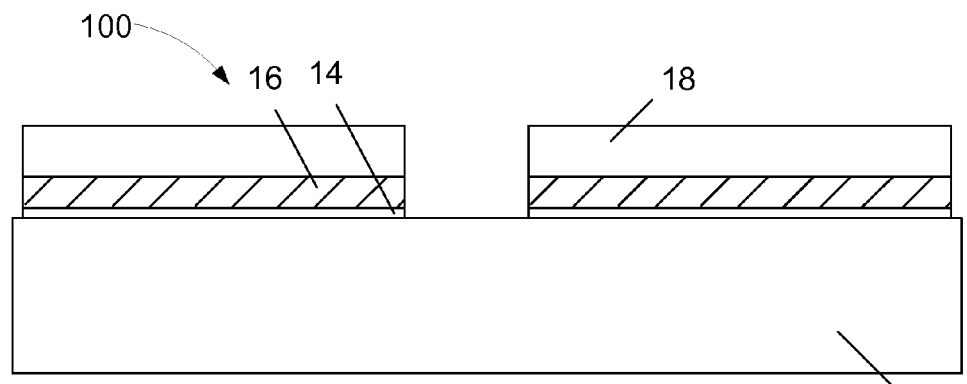
Figure 1C:
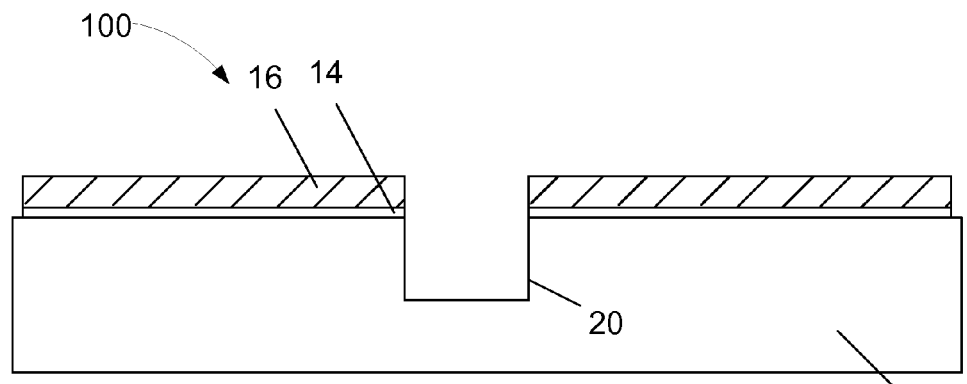

Thereafter, as shown in FIG. 1B, an etching process, such as a reactive ion etching process, is performed through the mask layer 18 to pattern the protection layer 14 and the polish stop layer 16. FIG. 1C depicts the device 100 after the masking layer 18 has been removed and an etching process, such as a reactive ion etching process, has been performed to form a trench 20 in the substrate 10 using the patterned protection layer 14 and polish stop layer 16 as an etch mask. For ease of illustration, the trench 20 is depicted as having a generally rectangular cross-section. In real-world devices, the sidewalls of the trench 20 will likely be somewhat inwardly tapered. The dimensions of the trench 20 may vary depending on the particular application. In current day devices, the trench 20 may have a depth of about 300-400 nm and a width of about 50-70 nm.

Figure 1D:
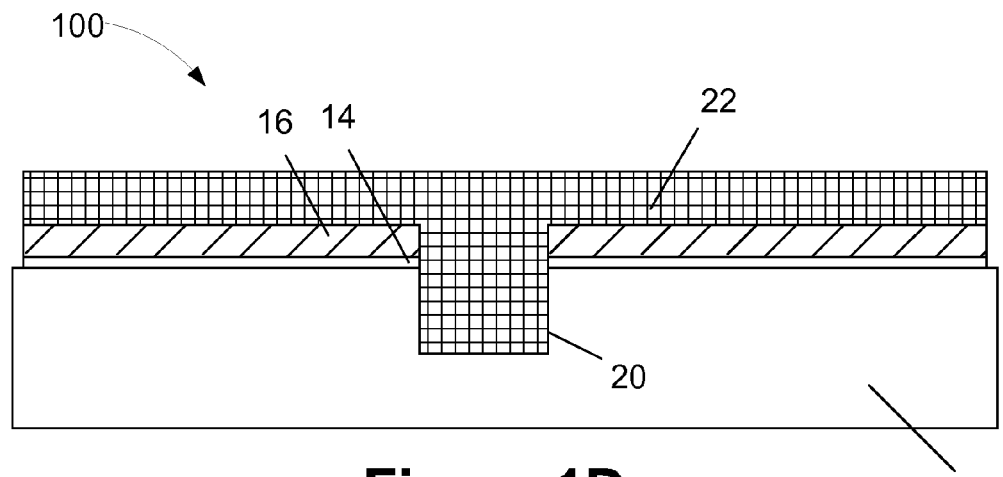

Next, as shown in FIG. 1D, a first deposition process is performed to form a layer of insulating material 22 on the device 100 and to over-fill the trench 20. The first layer of insulating material 22 may be comprised of a variety of different materials, such as, for example, silicon dioxide, etc., and it may be made using a variety of different processes, e.g., chemical vapor deposition (CVD), atomic layer deposition (ALD), etc., or plasma-enhanced versions of those processes. In one illustrative embodiment, the first layer of insulating material 22 may be a silicon dioxide material made using a so-called HARP (High Aspect Ratio) process available from Applied Materials. In general, the HARP process employs an ozone-TEOS process chemistry to produce what will be referred to as "HARP silicon dioxide."

Figure 1E:
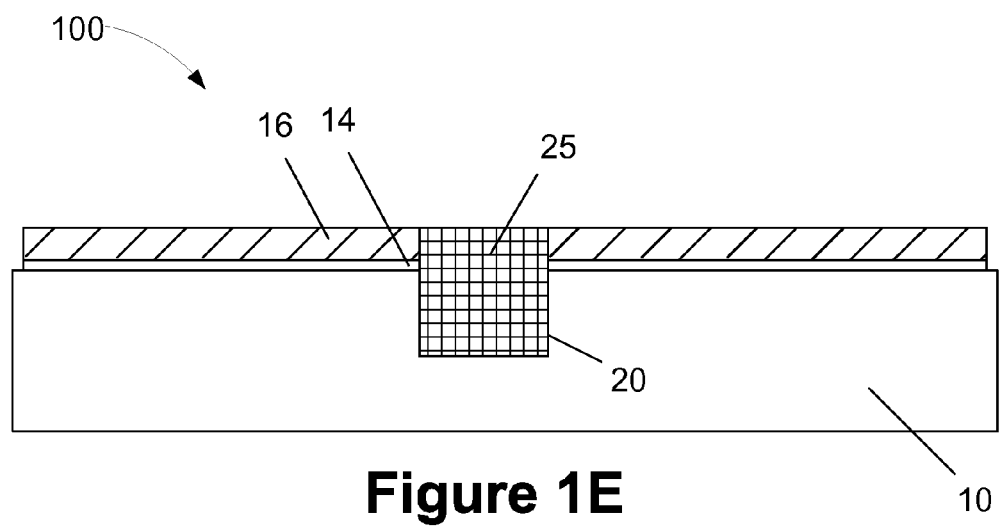

Next, as shown in FIG. 1E, a CMP process is then performed to remove the portions of the first layer of insulating material 22 positioned above the surface of the polish stop layer 16. This results in the formation of an initial trench isolation structure 25 in the trench 20.

Figure 1F:
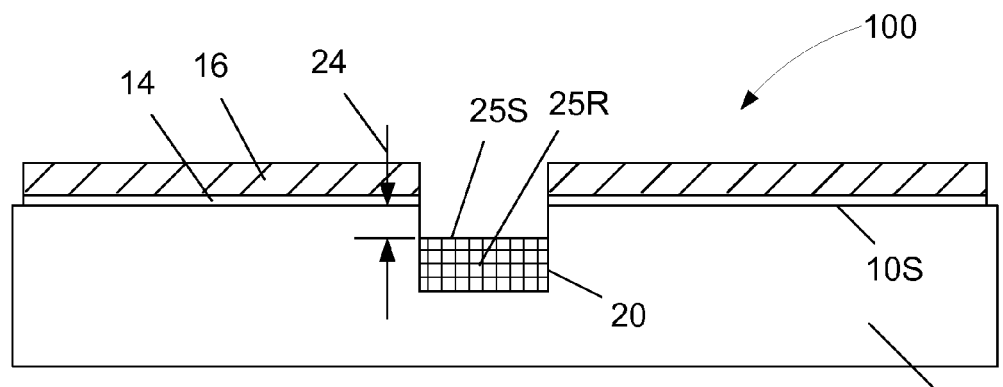

Then, an etching process, wet or dry, is performed to remove portions of the initial trench isolation structure 25 which results in the lower isolation structure 25R of what will become the overall trench isolation structure, as shown in FIG. 1F. In one illustrative embodiment, the upper surface 25S of the lower isolation structure 25R is a distance 24 of about 10-100 nm below the surface 10S of the substrate 10. Alternatively, after the deposition of the first layer of insulating material 22, the aforementioned CMP process may be omitted and an extended etching process may be performed to remove enough of the first layer of insulating material 22 such that the lower isolation structure 25R shown in FIG. 1F is all that remains of the first layer of insulating material 22.

Figure 1G:
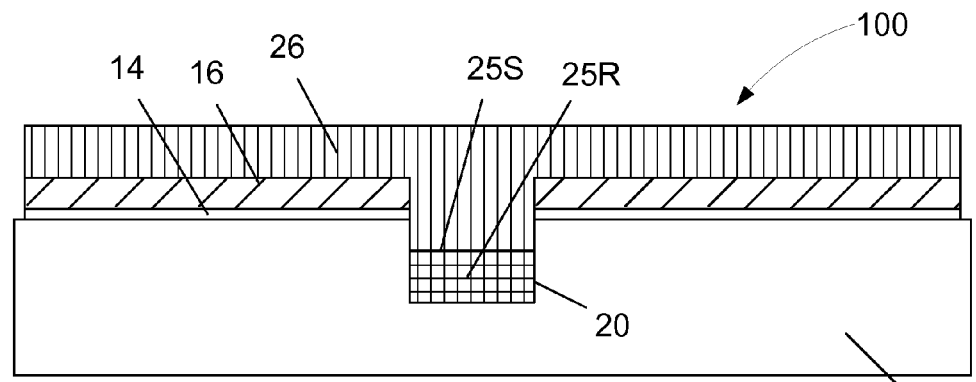

Next, as shown in FIG. 1G, a second deposition process is performed to form a second layer of insulating material 26 on the device 100 on top of the lower isolation structure 25R and to over-fill the trench 20. The second layer of insulating material 26 may be comprised of a variety of different materials, such as, for example, silicon dioxide, etc., and it may be made using a variety of different processes, e.g., chemical vapor deposition (CVD), atomic layer deposition (ALD), etc., or plasma-enhanced versions of those processes. In one illustrative embodiment, the second layer of insulating material 26 may be a silicon dioxide material made using a well-known HDP (High Density Plasma) process. Silicon dioxide material made using an HDP process will be referred to as an "HDP silicon dioxide."

Figure 1H:
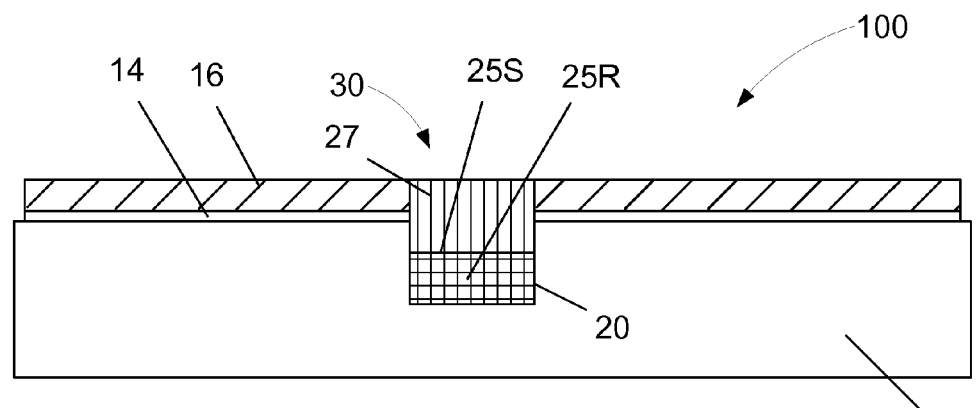
Figure 1I:
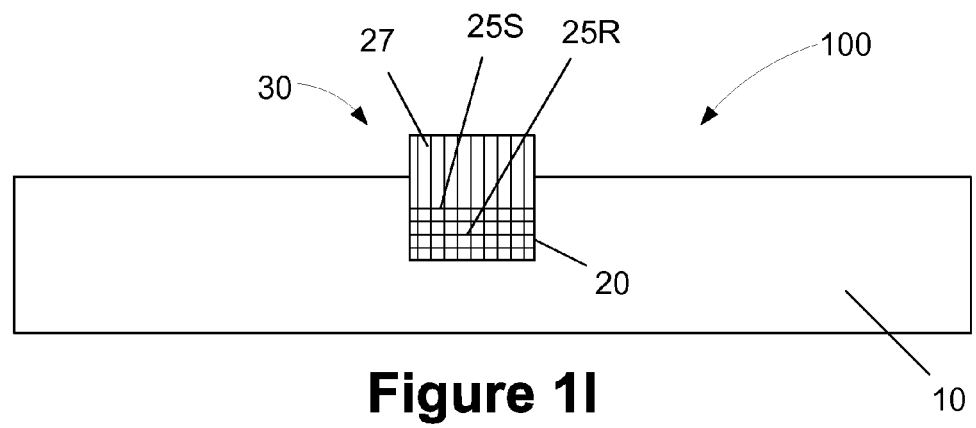

Next, as shown in FIG. 1H, a CMP process is then performed to remove the portions of the second layer of insulating material 26 positioned above the surface of the polish stop layer 16. This results in the formation of the upper isolation structure 27 of the overall trench isolation structure 30 on top of the lower isolation structure 25R. Thereafter, an etching or deglazing process is performed to insure that the surface of the polish stop layer 16 is free of any remnants of the second layer of insulating material 26. This deglaze process may reduce the thickness of the upper isolation structure 27 slightly, but such thickness reduction is not depicted in FIG. 1H. Then, as shown in FIG. 1I, one or more etching processes, wet or dry, are performed to remove the polish stop layer 16 and the protective layer 14.

In the depicted example, the novel STI structure 30 disclosed herein comprises the upper isolation structure 27 and the lower isolation structure 25R. In the disclosed embodiments, the upper isolation structure 27 and the lower isolation structure 25R are comprised of the same material, e.g., silicon dioxide, wherein the upper isolation structure 27 has a higher etch resistance to an etchant, such as a dilute HF acid, than does the lower isolation structure 25R. Thus, the novel STI structure 30 disclosed herein is better able to resist degradation in subsequent processing operations that are performed on the device 100. That is, the integrity of the STI structure 30 disclosed herein is greater than the integrity of prior art STI structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a trench in a semiconducting substrate, said trench comprising a bottom surface and sidewalls;
    forming a lower isolation structure on and in contact with said bottom surface and said sidewalls of said trench, said lower isolation structure having an upper surface that is below an upper surface of said substrate;
    forming an upper isolation structure above said lower isolation structure, wherein a first portion of said upper isolation structure is positioned within said trench and in contact with said sidewalls of said trench and a second portion of said upper isolation structure has an upper surface that extends above said upper surface of said semiconducting substrate; and
    completing a semiconductor device in an active region of said semiconducting substrate defined by said trench, said lower isolation structure, and said upper isolation structure.

2. The method of claim 1, wherein said upper isolation structure contacts said upper surface of said lower isolation structure.

3. The method of claim 1, wherein said lower isolation structure and said upper isolation structure are comprised of the same material, and wherein said lower isolation structure is formed by performing a first deposition process and said upper isolation structure is formed by performing a second deposition process, wherein said second deposition process results in said upper isolation structure having a higher etch resistance to an etchant used to etch said material than does said lower isolation structure.

4. The method of claim 1, wherein said lower isolation structure is a HARP silicon dioxide material and wherein said upper isolation structure is an HDP silicon dioxide material.

5. A method, comprising:
    forming a trench in a semiconducting substrate, said trench comprising a bottom surface and sidewalls;
    depositing a first layer of insulating material above said substrate on and in contact with said bottom surface and said sidewalls of said trench;
    removing portions of said first layer of insulating material to thereby define a lower isolation structure in said trench, said lower isolation structure having an upper surface that is below an upper surface of said substrate;
    depositing a second layer of insulating material above said substrate, said lower isolation structure, and on and in contact with said sidewalls of said trench;
    removing portions of said second layer of insulating material to thereby define an upper isolation structure above said lower isolation structure, wherein a first portion of said upper isolation structure is positioned within said trench and in contact with said bottom surface and said sidewalls of said trench and a second portion of said upper isolation structure has an upper surface that extends above said upper surface of said substrate; and
    completing a semiconductor device in an active region of said semiconducting substrate defined by said trench, said lower isolation structure, and said upper isolation structure.

6. The method of claim 5, wherein removing portions of said first layer of insulating material to thereby define a lower isolation structure in said trench comprises:
    performing a chemical mechanical polishing process to remove a first part of said first layer of insulating material and thereby leave a second part of said first layer of insulating material; and
    after performing said chemical mechanical polishing process, performing an etching process to remove a portion of said second part of said first layer of insulating material to thereby define said lower isolation structure.

7. The method of claim 5, wherein said second layer of insulating material has a higher etch resistance to an etchant used to etch said first layer of insulating material than does said first layer of insulating material.

8. A method, comprising:
    forming a trench in a semiconducting substrate, said trench comprising a bottom surface and sidewalls;
    performing a HARP process to deposit a layer of HARP silicon dioxide above said substrate on and in contact with said bottom surface and said sidewalls of said trench;
    removing portions of said layer of HARP silicon dioxide to thereby define a lower isolation structure comprised of HARP silicon dioxide [[in]] positioned within said trench and in contact with said bottom surface and said sidewalls of said trench, said lower isolation structure having an upper surface that is below an upper surface of said substrate;

performing a high density plasma (HDP) deposition process to deposit a layer of HDP silicon dioxide above said substrate, on and in contact with said sidewalls of said trench and above said lower isolation structure within said trench; and removing portions of said layer of HDP silicon dioxide to thereby define an upper isolation structure above said lower isolation structure, wherein a first portion of said upper isolation structure is positioned within said trench and a second portion of said upper isolation structure has an upper surface that extends above an said upper surface of said substrate.

9. The method of claim 8, wherein said upper isolation structure contacts said upper surface of said lower isolation structure.

* * * * *